(12) United States Patent
Yang et al.

(10) Patent No.: US 10,185,189 B2
(45) Date of Patent: Jan. 22, 2019

(54) DISPLAY DEVICE HAVING FEWER ELECTRODES

(71) Applicant: SAMSUNG DISPLAY CO., LTD., Yongin-si, Gyeonggi-do (KR)

(72) Inventors: Jihoon Yang, Seoul (KR); Myeongeon Kim, Suwon-si (KR); Cholho Kim, Suwon-si (KR); Keumdong Jung, Seoul (KR); Hyunyoung Choi, Gwangju (KR)

(73) Assignee: Samsung Display Co., Ltd. (KR)

( * ) Notice: Subject to any disclaimer, the term of this patent is extended or adjusted under 35 U.S.C. 154(b) by 148 days.

(21) Appl. No.: 15/055,323

(22) Filed: Feb. 26, 2016

(65) Prior Publication Data

US 2016/0291427 A1   Oct. 6, 2016

(30) Foreign Application Priority Data

Apr. 2, 2015   (KR) .......................... 10-2015-0046642

(51) Int. Cl.
*G02F 1/1343* (2006.01)
*G02F 1/1362* (2006.01)
*H01L 27/12* (2006.01)
*G02F 1/1339* (2006.01)

(52) U.S. Cl.
CPC .. *G02F 1/134363* (2013.01); *G02F 1/136209* (2013.01); *G02F 1/136286* (2013.01); *G02F 1/13394* (2013.01); *H01L 27/124* (2013.01); *H01L 27/1222* (2013.01)

(58) Field of Classification Search
CPC ..................... G02F 1/136209; G02F 1/134363
See application file for complete search history.

(56) References Cited

U.S. PATENT DOCUMENTS

| | | | | |
|---|---|---|---|---|
| 5,933,208 A | * | 8/1999 | Kim ................. | G02F 1/133516 349/104 |
| 7,834,970 B2 | * | 11/2010 | Kim ................. | G02F 1/133707 349/129 |
| 8,067,775 B2 | * | 11/2011 | Miyairi ............... | H01L 27/1225 257/72 |
| 2006/0285050 A1 | | 12/2006 | Yoo et al. | |
| 2009/0115947 A1 | * | 5/2009 | Huang ................ | G02F 1/13394 349/106 |
| 2013/0044285 A1 | | 2/2013 | Huang et al. | |

FOREIGN PATENT DOCUMENTS

| | | |
|---|---|---|
| KR | 10-2003-0028976 A | 4/2003 |
| KR | 10-2006-0133323 A | 12/2006 |
| KR | 10-2008-0056811 A | 6/2008 |
| KR | 10-2009-0120772 A | 11/2009 |

* cited by examiner

*Primary Examiner* — Dung Nguyen
(74) *Attorney, Agent, or Firm* — Innovation Counsel LLP

(57) ABSTRACT

A display device includes: a gate transmission wiring; a gate insulating layer disposed on the gate transmission wiring; and a pixel electrode and a data transmission wiring that are disposed on the gate insulating layer. When a gate signal voltage is applied to the gate transmission wiring, the gate transmission wiring may serve as a gate electrode that activates a semiconductor layer. In addition, when such a gate signal voltage is not applied thereto, the gate transmission wiring may form an electric field by a voltage difference between the gate transmission wiring and the pixel electrode, to thereby control a liquid crystal layer.

15 Claims, 6 Drawing Sheets

DISPLAY DEVICE HAVING FEWER ELECTRODES

CROSS-REFERENCE TO RELATED APPLICATION

This application claims the priority to, and all the benefits accruing under 35 U.S.C. § 119 of, Korean Patent Application No. 10-2015-0046642, filed on Apr. 2, 2015 with the Korean Intellectual Property Office (KIPO), the disclosure of which is incorporated herein in its entirety by reference.

BACKGROUND

1. Field

Embodiments of the present invention relate to a display device, and more particularly, to a display device in which a gate electrode and a common electrode are integrally formed.

2. Description of the Related Art

A liquid crystal display ("LCD") device is a type of flat panel display ("FPD") device which has found wide recent acceptance. An LCD device typically includes two substrates having electrodes formed thereon, and a liquid crystal layer interposed therebetween. In such an LCD device, liquid crystal molecules of the liquid crystal layer are rearranged upon voltages being applied to the two electrodes, and thereby the amount of transmitted light is adjusted in the LCD device.

An LCD device typically exhibits poor side visibility relative to its front visibility, and thus research on various schemes of liquid crystal alignment and various driving schemes of the LCD device is being continuously conducted in order to address the aforementioned issue.

Meanwhile, a thin film transistor substrate constituting an LCD device forms a circuit pattern by stacking a wiring or an electrode. Accordingly, simplifying its metal structures may be of great significance for reducing manufacturing costs in the manufacture of LCD devices.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Aspects of embodiments of the present invention are directed to a display device having a simpler electrode structure for forming a horizontal electric field that controls a liquid crystal layer.

According to an exemplary embodiment of the present invention, a display device includes: a first substrate and a second substrate opposing one another; a liquid crystal layer interposed between the first substrate and the second substrate; a gate transmission wiring including a gate line and a gate electrode that are disposed on the first substrate; a gate insulating layer disposed on the gate transmission wiring; a pixel electrode disposed on the gate insulating layer; a data transmission wiring including a data line and a data electrode that are disposed on the gate insulating layer; a transistor including a semiconductor layer disposed on the gate insulating layer, the transistor being in electrical communication with the gate transmission wiring, the data transmission wiring, and the pixel electrode; and a black matrix disposed on the gate insulating layer and the transistor so as to define a pixel region. The gate transmission wiring overlaps the pixel electrode and extends into the pixel region.

The gate transmission wiring may be a common electrode arranged to generate a voltage difference between the gate transmission wiring and the pixel electrode.

The gate transmission wiring may include one of indium-tin oxide (ITO) and indium-zinc oxide (IZO).

The gate transmission wiring may have a planar shape.

The black matrix may include at least one of an organic layer and an inorganic layer.

The pixel electrode may contact the semiconductor layer.

The display device may further include a transparent electrode layer positioned between the data transmission wiring and the semiconductor layer.

The transparent electrode layer may comprise a same material as that of the pixel electrode.

The pixel electrode may include a stem portion extending in a direction substantially perpendicular to the data line, and a branch portion extending from the stem portion to be oriented substantially parallel to the data line.

The branch portion may include a plurality of branches spaced apart from one another.

The semiconductor layer may comprise one of a semiconductive oxide, amorphous silicon, and crystalline silicon.

The display device may further include a spacer disposed at an end portion of the pixel electrode.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of invention will be more clearly understood from the following detailed description taken in conjunction with the accompanying drawings, in which.

DETAILED DESCRIPTION

Figure 1:
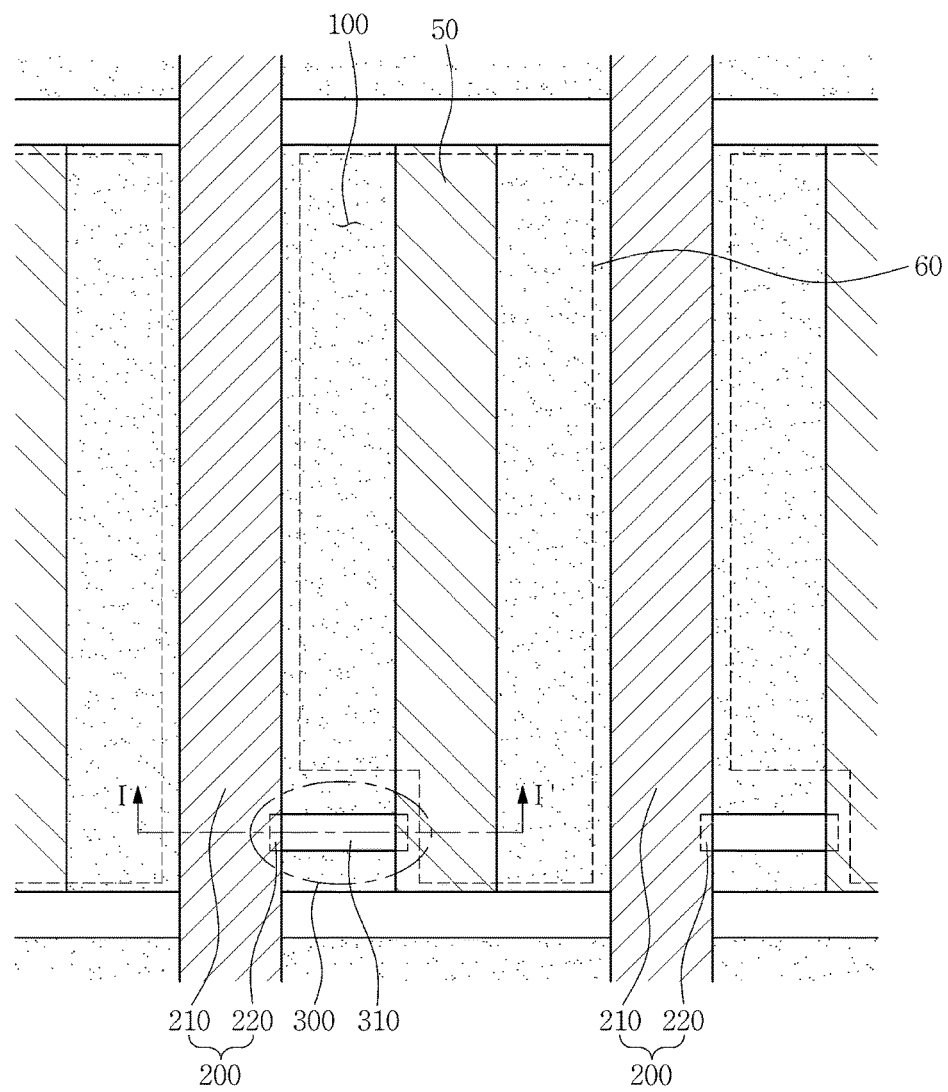
FIG. 1 is a plan view illustrating a pixel according to an exemplary embodiment.

Hereinafter, exemplary embodiments of the present invention will now be described in more detail with reference to the accompanying drawings. The invention may, however, be embodied in many different forms and should not be construed as being limited to the exemplary embodiments set forth herein. Rather, these exemplary embodiments are provided so that this disclosure will be thorough and complete, and will fully convey the scope of the invention to those skilled in the art. All numerical values are approximate, and may vary. All examples of specific materials and compositions are to be taken as nonlimiting and exemplary only. Other suitable materials and compositions may be used instead.

In the drawings, certain elements or shapes may be simplified or exaggerated to better illustrate the present invention, and other elements present in an actual product may also be omitted. Thus, the drawings are not to scale, and are intended only to facilitate the understanding of the present invention. Like reference numerals refer to like elements throughout the specification.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

When a layer or element is referred to as being "on" another layer or element, the layer or element may be directly on the other layer or element, or one or more intervening layers or elements may be interposed therebetween.

Hereinafter, a display device according to an exemplary embodiment will be described with reference to FIGS. 1 and 2A.

Figure 2A:
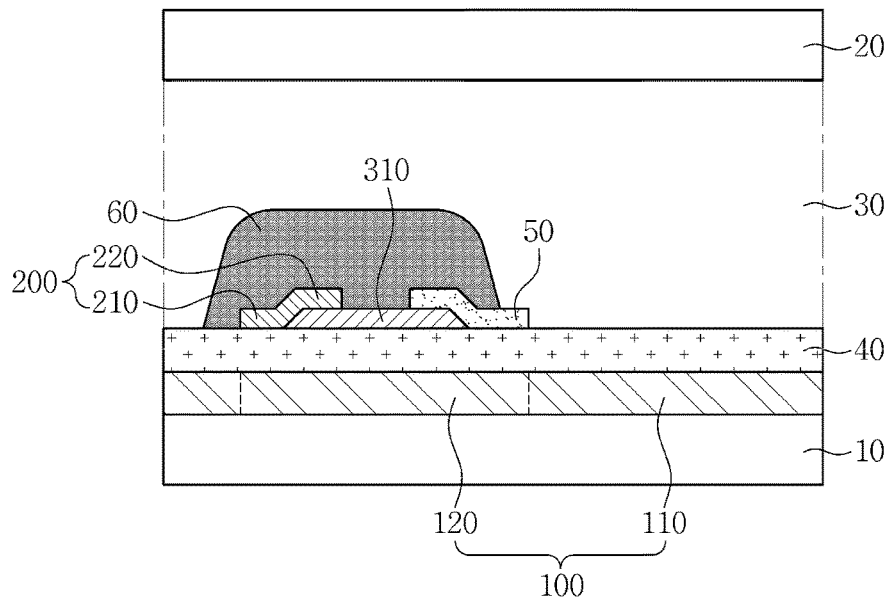
FIG. 2A is a cross-sectional view taken along line I-I' of FIG. 1.

FIG. 1 is a plan view illustrating a pixel according to an exemplary embodiment; and FIG. 2A is a cross-sectional view taken along line I-I' of FIG. 1.

Referring to FIGS. 1 and 2A, the display device according to the exemplary embodiment may include a first substrate 10, a second substrate 20 opposing the first substrate 10, a liquid crystal layer 30 interposed between the first substrate 10 and the second substrate 20, a gate transmission wiring 100 disposed on the first substrate 10, a gate insulating layer 40, a pixel electrode 50, a data transmission wiring 200, a transistor 300, and a black matrix 60.

The first substrate 10 may serve as a base substrate. Accordingly, elements of the display device which are to be described further below may be stacked upward from the first substrate 10. The first substrate 10 may be an insulating substrate formed of a transparent material such as a glass or a plastic.

Although not illustrated, the first substrate 10 may include an alignment layer. The alignment layer may be a homeotropic or horizontal alignment layer, or an alignment layer including a photo-reactive material. In addition, the alignment layer may be formed of one or more of the following materials: polyamic acid, polysiloxane, and polyimide.

The second substrate 20 may be disposed to oppose the first substrate 10. The second substrate 20 may be an insulating substrate formed of a transparent material such as a glass or a plastic, in a manner similar to that of the first substrate 10. In addition, the second substrate 20 may be formed of the same material as that forming the aforementioned alignment layer.

The liquid crystal layer 30 may include a nematic liquid crystal material having a positive dielectric anisotropy. A liquid crystal molecule of the liquid crystal layer 30 may be aligned to have a major axis thereof oriented parallel to one of the first substrate 10 and the second substrate 20. Accordingly, in an initial alignment state of the liquid crystal molecule in which no electric field is applied thereto, light may not be transmitted through the liquid crystal layer 30. On the other hand, when an electric field is applied thereto via voltages applied to the corresponding field generating electrodes, the major axis of the liquid crystal molecule may rotate in a direction of the electric field. In this case, light may be transmitted due to a phase delay caused by a difference between propagation velocities of an ordinary wave and an extraordinary wave that are transmitted through the liquid crystal layer 30, such a difference being generated based on a birefringence effect of the liquid crystal molecule.

A description pertaining to the gate transmission wiring 100 will be provided with reference to FIGS. 1, 2A, and 3 hereinbelow.

Figure 3:
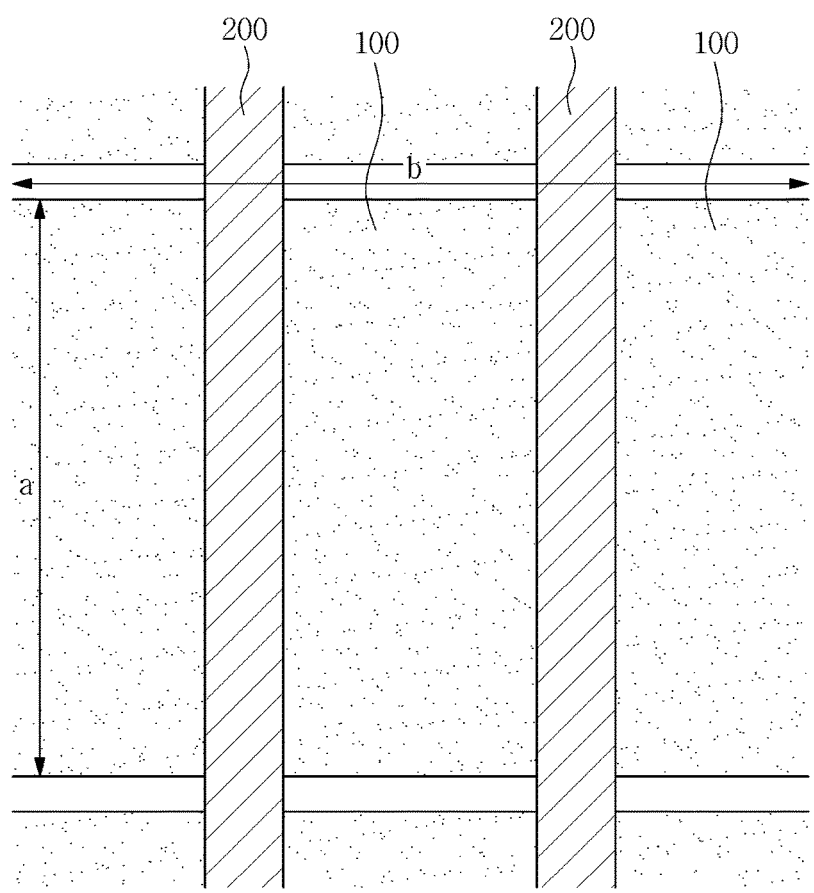
FIG. 3 is a plan view schematically illustrating an example of the gate transmission wiring and data transmission wiring of FIG. 1.

FIG. 3 is a plan view schematically illustrating an example of the gate transmission wiring 100 and the data transmission wiring 200 of FIG. 1.

The gate transmission wiring 100 may be disposed on the first substrate 10, and may include a gate line 110 and a gate electrode 120. A gate insulating layer 40, which is to be described further below, may be formed on the gate transmission wiring 100.

Referring to FIG. 3, the gate transmission wiring 100 may have a planar shape, e.g. may be formed as a flat rectangular layer. The gate transmission wiring 100, having a substantially rectangular shape, may be formed on the first substrate 10 to extend therefrom in a direction.

In detail, the gate transmission wiring 100 may have a rectangular shape in which a short side "a" thereof having a predetermined length is shorter than a long side "b" thereof. The gate transmission wiring 100 may be disposed to have the long side "b" extend in a direction substantially perpendicular to the data transmission wiring 200, as shown in FIG. 3.

A portion of the gate transmission wiring 100 provided along the long side "b" thereof may serve as the gate line 110, and a portion of the gate transmission wiring 100 overlapping the transistor 300, which is to be described further below, may serve as the gate electrode 120. That is, an overlap area between the gate transmission wiring 100 and the transistor 300 may serve as the gate electrode 120, and the remainder of the gate transmission wiring 100 may serve as a common electrode forming an electric field by generating a voltage difference between the gate transmission wiring 100 and the pixel electrode 50.

Accordingly, the gate transmission wiring 100 may be formed to overlap the transistor 300 and the pixel electrode 50 in order to operate the transistor 300 or serve as the common electrode forming the electric field.

However, the gate transmission wiring 100 is not limited to having the aforementioned shape. For example, although not illustrated, the gate transmission wiring may comprise a gate line, a common electrode portion, and a gate electrode portion. The gate line may be extended in direction substantially perpendicular to the data transmission wiring 200, and the common electrode portion protrude from the gate line to be overlapped with the pixel electrode 50. Also, the common electrode portion protrude from the gate line to be overlapped with the transistor 300. A detailed description pertaining to an operation of the gate transmission wiring 100 will be provided further below.

More particularly, the gate transmission wiring 100 may be formed of a light-transmissive or transparent material. For example, the gate transmission wiring 100 may be formed of oxide including indium (In), zinc (Zn), tin (Sn), or the like. In detail, the gate transmission wiring 100 may be formed of a transparent conductive material such as indium-tin oxide (ITO) or indium-zinc oxide (IZO). The gate transmission wiring 100 may include such a transparent material since a pixel region including the pixel electrode 50 is disposed upward from the gate transmission wiring 100.

The gate transmission wiring 100 according to the exemplary embodiment may function as the gate electrode 120 operating the transistor 300 and may also function as the common electrode that forms an electric field between the gate transmission wiring 100 and the pixel electrode 50 to control the liquid crystal layer 30. In this manner, the overall manufacturing process may be simplified as compared to a case of forming the gate electrode and the common electrode as separate structures.

Hereinafter, a description pertaining to the gate insulating layer 40 and the transistor 300 will be provided with reference to FIG. 2A.

The gate insulating layer 40 may be disposed on the gate transmission wiring 100. In this case, the gate insulating layer 40 may be formed on substantially an entire surface of the gate transmission wiring 100, which includes the gate line 110 and the gate electrode 120. The gate insulating layer 40 may be formed of silicon nitride ($SiN_x$), silicon oxide ($SiO_x$), or the like. The gate insulating layer 40 may have a multilayer structure including at least two insulating layers having different physical properties from one another.

The gate insulating layer 40 may serve to prevent a short-circuit between adjacent gate transmission wirings 100. In addition, the gate insulating layer 40 may serve to insulate the gate transmission wiring 100 from another conductive thin film to be formed on the gate transmission wiring 100.

The gate insulating layer 40, which is formed on the gate transmission wiring 100, may include a pixel region through which light is transmitted. Accordingly, the gate insulating layer 40 may include a light-transmissive or transparent material.

The transistor 300 may be disposed on the gate insulating layer 40. In detail, the transistor 300 may include a semiconductor layer 310 which is disposed on the gate insulating layer 40, and may be connected to the gate transmission wiring 100, the data transmission wiring 200, and the pixel electrode 50 which is to be described further below.

In general, the transistor 300 includes a source electrode, a semiconductor layer, a drain electrode, and a gate electrode. The source electrode and the drain electrode may include a refractory metal such as molybdenum (Mo), chromium (Cr), tantalum (Ta), titanium (Ti), or an alloy thereof. In addition, the transistor 300 may have a multilayer structure including a refractory metal layer and a low-resistance conductive layer. Examples of such a multilayer structure may include: a double-layer structure including a Cr or Mo (or Mo alloy) lower layer and an aluminum (Al) (or Al alloy) upper layer; and a triple-layer structure including a Mo (or Mo alloy) lower layer, an Al (or Al alloy) intermediate layer, and a Mo (or Mo alloy) upper layer.

The transistor 300 according to the exemplary embodiment may form a source electrode by connecting the semiconductor layer 310 to the data transmission wiring 200, which is to be described further below. In addition, the transistor 300 according to the exemplary embodiment may form a drain electrode by connecting the semiconductor layer 310 to the pixel electrode 50.

However, as another example, the transistor 300 may form a drain electrode by connecting the semiconductor layer 310 to the data transmission wiring 200, and may form a source electrode by connecting the semiconductor layer 310 to the pixel electrode 50.

In other words, the transistor 300 may include a source electrode connected to one of the data transmission wiring 200 and the pixel electrode 50, and a drain electrode connected to the other thereof.

Further, a portion of the gate transmission wiring 100 overlapping the transistor 300 may form the gate electrode 120.

Meanwhile, the semiconductor layer 310 may be formed of an oxide of a material selected from among Zn, In, gallium (Ga), Sn, and any combination thereof, or any semiconductive oxide. Moreover, the semiconductor layer 310 may include one of amorphous silicon and crystalline silicon.

A description pertaining to the data transmission wiring 200 will be provided hereinbelow.

Referring to FIGS. 1 and 2A, the data transmission wiring 200 may be disposed on the gate insulating layer 40. The data transmission wiring 200 may be formed to extend largely along a particular direction, and may intersect the gate transmission wiring 100. In other words, at least part of the data transmission wiring 200 may be disposed in a direction substantially perpendicular to the gate transmission wiring 100.

In addition, the data transmission wiring 200 may include a data line 210 and a data electrode 220. The data line 210 may transmit an image data signal to the pixel electrode 50.

The data electrode 220 may refer to a portion of the data transmission wiring 200 at which the data line 210 is in contact with the semiconductor layer 310. The data electrode 220 may be substantially a portion of the data line 210, and may serve as the source electrode or the drain electrode of the transistor 300.

Although not illustrated, in another exemplary embodiment, a data electrode 220 may be formed to protrude or extend outward from a data line 210. In this case, the data electrode 220, protruding from the data line 210, may overlap a semiconductor layer 310 or otherwise be in contact with at least a portion of the semiconductor layer 310.

Figure 2B:
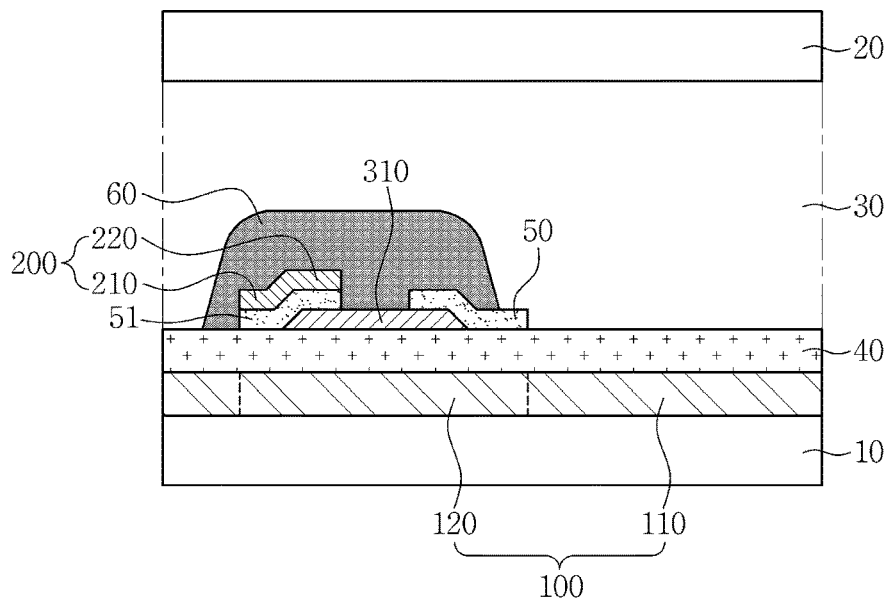
FIG. 2B is a cross-sectional view taken along line I-I' of FIG. 1 according to another exemplary embodiment.

Hereinafter, a data transmission wiring 200 according to another exemplary embodiment will be described with reference to FIG. 2B. FIG. 2B is a cross-sectional view taken along line I-I' of FIG. 1 according to another exemplary embodiment.

Referring to FIG. 2B, a transparent electrode layer 51 may be additionally disposed below the data transmission wiring 200. In other words, the transparent electrode layer 51 may be disposed on the gate insulating layer 40 and semiconductor layer 310, and the data transmission wiring 200 may be disposed on the transparent electrode layer 51. The transparent electrode layer 51 may be a conductor through which a current may flow, and may be formed of the same material as that forming a pixel electrode 50 which is to be described further below. In addition, the transparent electrode layer 51 may be formed substantially simultaneously with the pixel electrode 50.

In order to additionally dispose the transparent electrode layer 51 below the data transmission wiring 200 as described above, a diffraction exposure mask may be used. Although not illustrated, a process of forming the data transmission wiring 200 and the transparent electrode layer 51 using such a diffraction exposure mask will be described hereinbelow according to the exemplary embodiment of FIG. 2B.

A pixel electrode layer for forming the pixel electrode 50 and a data electrode layer for forming the data transmission wiring 200 may be sequentially stacked on the gate insulating layer 40, and a photoresist layer may be coated on the data electrode layer.

In a state in which the diffraction exposure mask is disposed on the photoresist layer, light such as ultraviolet (UV) light may be irradiated on to the diffraction exposure mask and a development process for the photoresist layer may be performed. Upon completion of the development process, a photoresist layer pattern may be formed.

In this instance, a thickness of the photoresist layer pattern may vary based on a position thereof. The varying thickness of the photoresist layer pattern may result from the fact that the diffraction exposure mask includes a plurality of light-transmissive areas through which different amounts of light are transmitted. Accordingly, a portion of the diffraction exposure mask having a relatively small amount of light being transmitted therethrough may result in a relatively thick photoresist layer pattern, and a portion of the diffraction exposure mask having a relatively larger amount of light being transmitted therethrough may result in a relatively thin photoresist layer pattern.

A portion of the diffraction exposure mask in which the photoresist layer pattern is absent may be removed by etching, the exposure and development processes may be re-performed using the diffraction exposure mask, and thereby the portions of the diffraction exposure mask having relatively thin photoresist layer patterns may be exposed. The exposed portion of the diffraction exposure mask may be removed by etching, a remaining portion of the photoresist layer pattern may be removed through an ashing process, and thereby the data transmission wiring 200 and the transparent electrode layer 51 may be formed as illustrated in another exemplary embodiment of FIG. 2B.

The transparent electrode layer 51 and the gate insulating layer 40 may include any material that includes a conductive material. However, more particularly, the transparent electrode layer 51 may include the same material as that forming the pixel electrode 50. Accordingly, the transparent electrode layer 51 and the pixel electrode 50 may be substantially simultaneously formed.

In addition, the forming (or stacking) of the transparent electrode layer 51 and the data transmission wiring 200 may be carried out in various ways. In other words, the transparent electrode layer 51 may be formed on the gate insulating layer 40 and then the data transmission wiring 200 may be formed thereon; however, the sequence of forming the transparent electrode layer 51 and the data transmission wiring 200 may vary as desired.

The pixel electrode 50 may be disposed on the gate insulating layer 40. Referring to FIG. 1, the pixel electrode 50 may have a substantially linear or quadrilateral shape, and may be formed on the gate insulating layer 40 to be oriented substantially parallel to the data transmission wiring 200. A side of the pixel electrode 50 may be connected to the transistor 300. In detail, the pixel electrode 50 may be in direct contact (or otherwise in electrical communication) with the semiconductor layer 310. Accordingly, the pixel electrode 50 may serve as a source electrode or a drain electrode of the transistor 300.

The pixel electrode 50 may be formed of a transparent conductive material such as ITO or IZO. In this instance, ITO may be a polycrystalline or monocrystalline material, and IZO may also be a polycrystalline or monocrystalline material.

Meanwhile, the pixel electrode 50 may be disposed to overlap the gate transmission wiring 100. In addition, the pixel electrode 50 may be disposed to be spaced apart from the data transmission wiring 200 while having the semiconductor layer 310 positioned therebetween.

Figure 5:
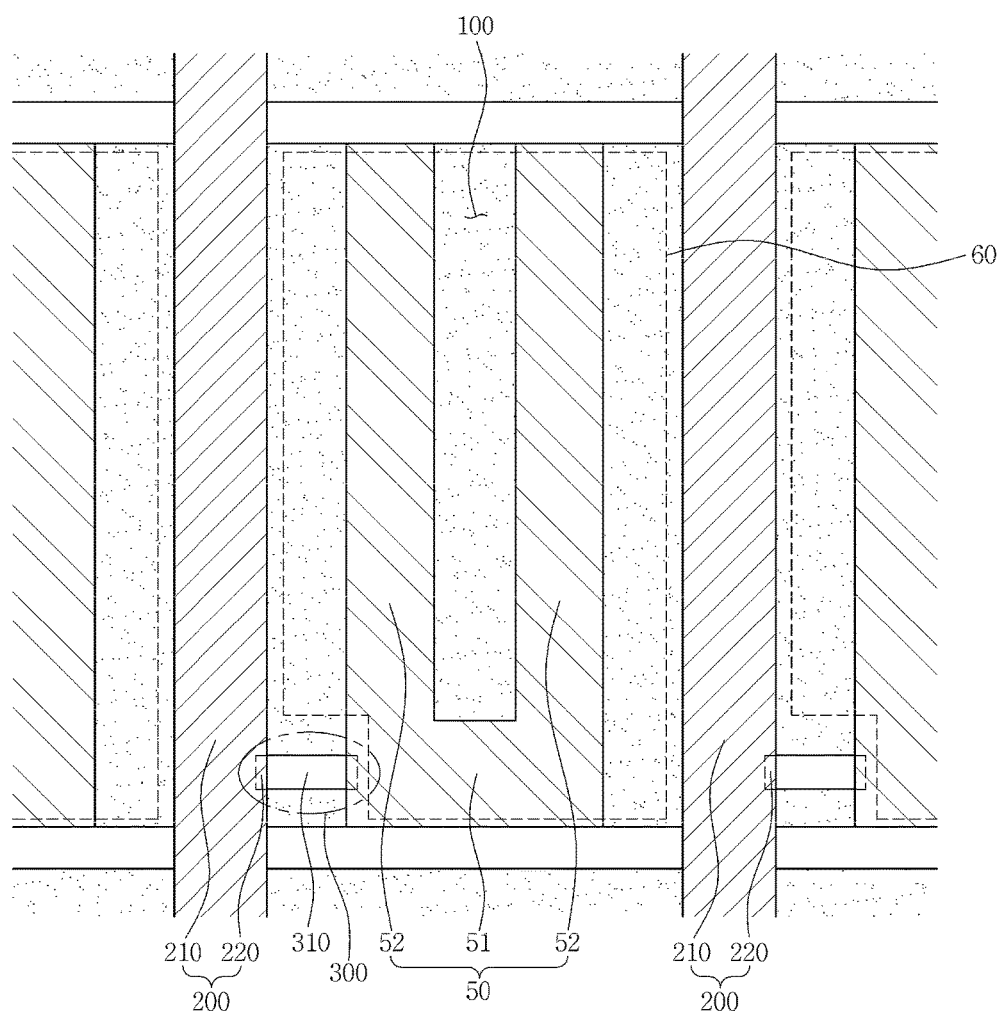
FIG. 5 is a plan view illustrating a pixel electrode according to still another exemplary embodiment.

FIG. 5 is a plan view illustrating a pixel electrode according to still another exemplary embodiment. Referring to FIGS. 2A and 5, a pixel electrode 50 may include a stem portion 51 and a branch portion 52. The stem portion 51 may be formed to extend in a direction that intersects a data transmission wiring 200. In other words, the stem portion 51 may be disposed in a direction substantially perpendicular to the data transmission wiring 200.

The branch portion 52 may be formed with one or more extensions that protrude from the stem portion 51 to be oriented substantially parallel to the data transmission wiring 200. In other words, the branch portion 52 may have extensions disposed to be substantially parallel to the data transmission wiring 200. The branch portion 52 may include a plurality of branches each of which may extend substantially parallel to the wiring 200. The branches of the branch portion 52 may be formed to be spaced apart from one another along a length direction of the stem portion 51. The stem portion 51 and the branch portion 52 may be integrally formed.

A black matrix 60 may be disposed on a gate insulating layer 40, the data transmission wiring 200, and a transistor 300. The black matrix 60 may prevent light from being emitted areas other than the pixel regions. In other words, the black matrix 60 may prevent light leakage from non-pixel regions. To this end, the black matrix 60 may cover substantially all areas aside from the pixel regions. Accordingly, the pixel regions may be defined by the black matrix 60. The black matrix 60 may have a dielectric constant in a range of about 3 to about 5 and may include at least one of an organic layer and an inorganic layer.

Meanwhile, the display device according to the exemplary embodiment may further include a spacer.

Figure 6:
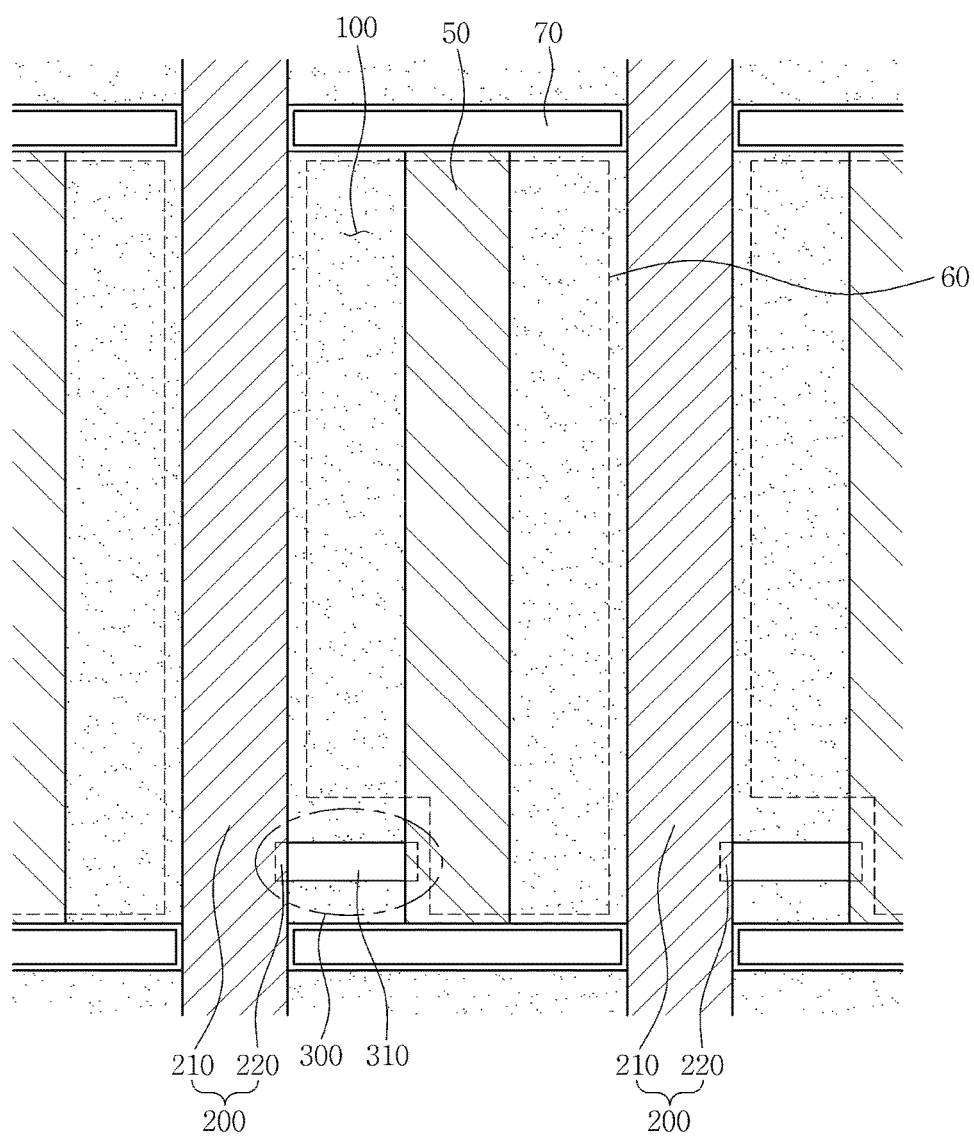
FIG. 6 is a plan view illustrating a pixel according to yet another exemplary embodiment.

FIG. 6 is a plan view illustrating a pixel according to yet another exemplary embodiment.

Referring to FIGS. 2A and 6, a spacer 70 may be disposed at an end portion of a pixel electrode 50 and may be formed on a black matrix 60. The spacer 70 may maintain a predetermined interval between a first substrate 10 and an opposing second substrate 20. The spacer 70 may be formed of, for example, a silica or resin particle having a spherical shape.

For desired operation of the display device according to the exemplary embodiment, the predetermined interval between the first substrate 10 and the second substrate 20 may preferably be maintained. Otherwise, an issue of non-uniformity in displaying images over an entire screen of the display device may arise. The spacer 70 may maintain the predetermined interval between the first substrate 10 and the second substrate 20, thereby preventing such a display non-uniformity issue.

Hereinafter, a further description of the operation of the gate transmission wiring 100 will be provided with reference to FIGS. 2A and 4.

In a case in which a gate signal voltage is applied to the gate line 110, the gate transmission wiring 100 may operate the transistor 300 so as to activate the semiconductor layer 310. When the semiconductor layer 310 is activated, a data signal voltage applied to the data line 210 may be transmitted from the data electrode 220 to the pixel electrode 50. Accordingly, the pixel electrode 50 may have the data signal voltage.

Conversely, in a case in which a gate signal voltage of sufficient magnitude to turn on transistor 300 is not applied to the gate line 110, the gate transmission wiring 100 may have a predetermined voltage. For example, the gate line 110 carries a nonzero voltage that is lower than the turn-on voltage of transistor 300. Accordingly, the gate transmission wiring 100 may form an electric field by a voltage difference between the gate transmission wiring 100 and the pixel electrode 50 while the gate signal voltage is not applied. Such an electric field may control the liquid crystal layer 30 to thereby adjust an amount of light being transmitted therethrough.

Figure 4:
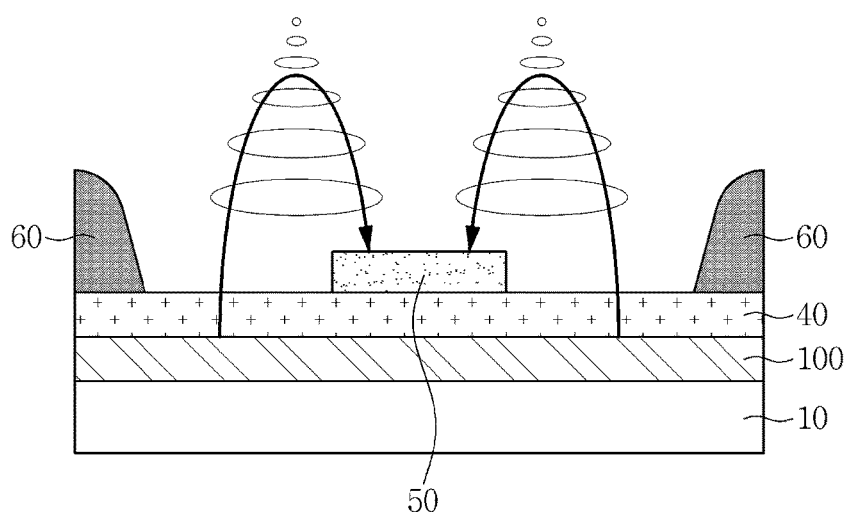
FIG. 4 is a view illustrating an electric field generated by a voltage difference between the gate transmission wiring and a pixel electrode of FIG. 1.

FIG. 4 is a view illustrating the electric field generated by the voltage difference between the gate transmission wiring 100 and the pixel electrode 50 of FIG. 1.

As previously described, the gate transmission wiring 100 may serve as a common electrode having a predetermined voltage in the case in which the gate signal voltage is not applied to the gate line 110. Accordingly, the electric field may be formed by the voltage difference between the gate transmission wiring 100 and its overlying pixel electrode 50.

Such an electric field may adjust a position of liquid crystal molecules of the liquid crystal layer 30, based on an intensity of the electric field. In this instance, whether a light is transmitted through the liquid crystal layer 30 or not, and an amount of the light being transmitted therethrough, may vary based on the position of the liquid crystal molecules.

As set forth above, according to one or more exemplary embodiments, the gate transmission wiring may overlap the data transmission wiring, the transistor, and the pixel electrode while having the gate insulating layer positioned therebetween. In this instance, the gate transmission wiring may simultaneously function as both the gate electrode for operating the transistor, and as the common electrode. Accordingly, an additional common electrode and an insulating layer which is necessary for forming the common electrode may not need to be formed. In this regard, a metal structure for forming a horizontal electric field may be simplified.

In addition, the simplification of the metal structure may lead to the reduced number of electrodes or wirings to be stacked, thus increasing process yield and reducing manufacturing costs.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the invention.

What is claimed is:

1. A display device comprising:
 a first substrate and a second substrate opposing one another;
 a liquid crystal layer interposed between the first substrate and the second substrate;
 a gate transmission wiring including a gate line and a gate electrode that are disposed on the first substrate;
 a gate insulating layer disposed on the gate transmission wiring;
 a pixel electrode disposed on the gate insulating layer;
 a data transmission wiring including a data line and a data electrode that are disposed on the gate insulating layer;
 a transistor including a semiconductor layer disposed on the gate insulating layer, the transistor being in electrical communication with the gate transmission wiring, the data transmission wiring, and the pixel electrode; and
 a black matrix disposed on the gate insulating layer and the transistor so as to define a pixel region,
 wherein the gate transmission wiring completely overlaps the pixel electrode and extends into the pixel region.

2. The display device of claim 1, wherein the gate transmission wiring is a common electrode arranged to generate a voltage difference between the gate transmission wiring and the pixel electrode.

3. The display device of claim 2, wherein the gate transmission wiring includes one of indium-tin oxide (ITO) and indium-zinc oxide (IZO).

4. The display device of claim 3, wherein the gate transmission wiring has a planar shape.

5. The display device of claim 1, wherein the black matrix includes at least one of an organic layer and an inorganic layer.

6. The display device of claim 1, wherein the pixel electrode contacts the semiconductor layer.

7. The display device of claim 1, further comprising a transparent electrode layer positioned between the data transmission wiring and the semiconductor layer.

8. The display device of claim 7, wherein the transparent electrode layer comprises a same material as that of the pixel electrode.

9. The display device of claim 1, wherein the pixel electrode includes a stem portion extending in a direction substantially perpendicular to the data line, and a branch portion extending from the stem portion to be oriented substantially parallel to the data line.

10. The display device of claim 9, wherein the branch portion includes a plurality of branches spaced apart from one another.

11. The display device of claim 1, wherein the semiconductor layer comprises one of a semiconductive oxide, amorphous silicon, and crystalline silicon.

12. The display device of claim 1, further comprising a spacer disposed at an end portion of the pixel electrode.

13. The display device of claim 1, wherein the gate transmission wiring having a width greater than a width of the pixel region.

14. The display device of claim 13, wherein the gate transmission wiring is applied with a gate signal voltage to turn on the transistor to transmit a data voltage to the pixel electrode and is applied with a common voltage while the gate signal voltage is not applied to the gate transmission wiring.

15. The display device of claim 1, wherein the gate transmission wiring is applied with a gate signal voltage to turn on the transistor to transmit a data voltage to the pixel electrode and is applied with a common voltage while the gate signal voltage is not applied to the gate transmission wiring.

* * * * *